United States Patent [19]

Sugano et al.

[11] Patent Number: 4,678,945
[45] Date of Patent: Jul. 7, 1987

[54] UNIDIRECTIONAL SINGLE-FLUX-QUANTUM LOGIC CIRCUIT

[75] Inventors: Takuo Sugano; Yoichi Okabe; Hideharu Miyake, all of Tokyo; Naoki Fukaya, Kawasaki, all of Japan

[73] Assignee: University of Tokyo, Tokyo, Japan

[21] Appl. No.: 701,488

[22] Filed: Feb. 14, 1985

[30] Foreign Application Priority Data

Mar. 24, 1984 [JP] Japan .................................. 59-56549

[51] Int. Cl.[4] .......................................... H03K 19/195
[52] U.S. Cl. ...................................... 307/476; 307/307
[58] Field of Search .............. 307/462, 476, 277, 306; 377/93; 357/5; 365/162

[56] References Cited

U.S. PATENT DOCUMENTS

4,117,354 9/1978 Gheewala ........................... 307/462
4,473,833 9/1984 Beha et al. ........................... 307/306

OTHER PUBLICATIONS

H. Beha et al, Magnetically Programmable Current Injection Interferometer Logic Device, IBM Technical Disclosure Bulletin, vol. 24, No. 7A, Dec. 1981, pp. 3191-3192.

Mail-A New Josephson Logic Family, H. Beha, IEEE Journal of Solid-State Circuits, vol. SC-17, No. 3, Jun., 1986, pp. 562-568.

Primary Examiner—John Zazworsky
Attorney, Agent, or Firm—Sughrue, Mion, Zinn, Macpeak and Seas

[57] ABSTRACT

A superconducting logic circuit has a first and a second one-junction SQUID's (superconducting quantum interference device) connected by a superconducting inductor, the junction of the second SQUID having a larger critical current than that of the first SQUID, the inductance of the second SQUID being smaller than that of the inductor, and a signal applied to the first SQUID is unidirectionally transmitted to the second SQUID by applying bias currents to the junctions of the two SQUID's.

11 Claims, 7 Drawing Figures

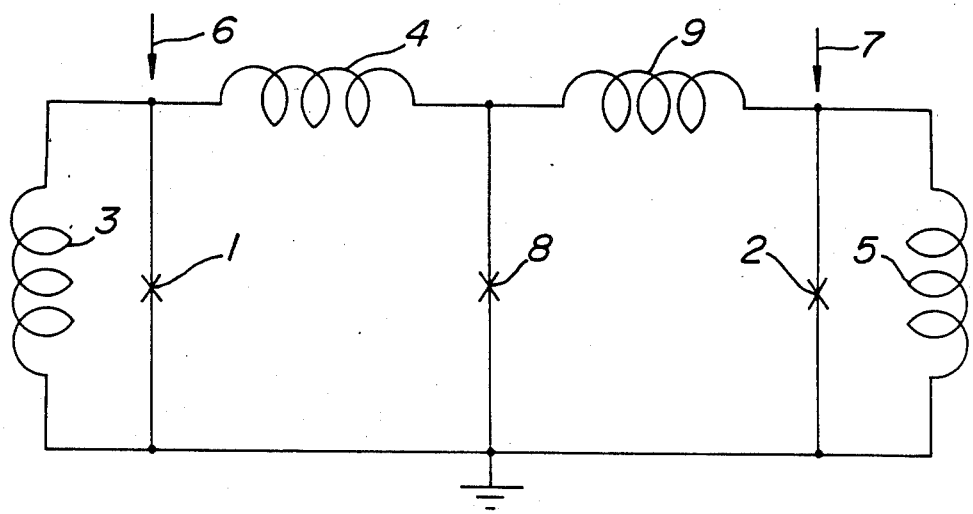
FIG_3
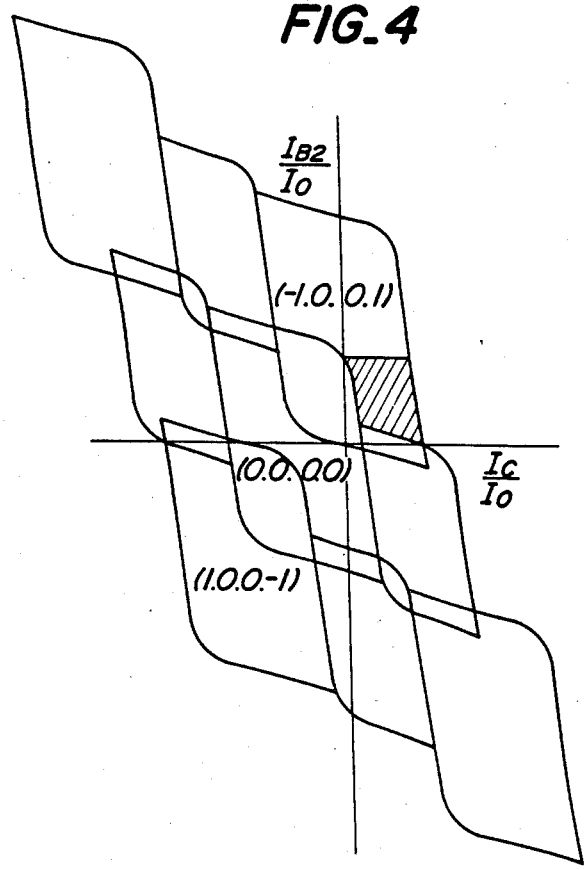
FIG_4

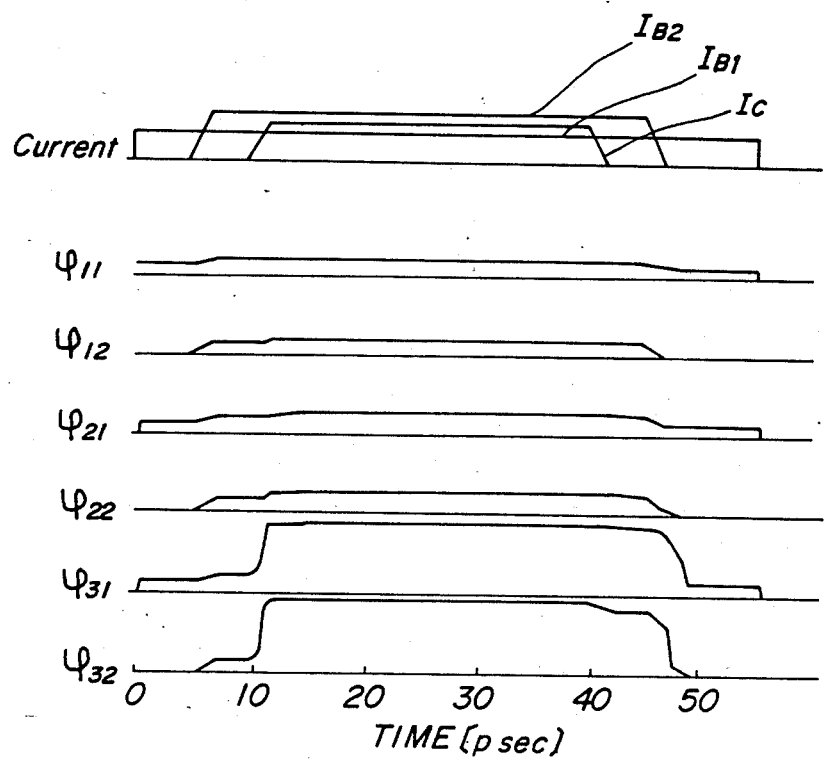

UNIDIRECTIONAL SINGLE-FLUX-QUANTUM LOGIC CIRCUIT

BACKGROUND OF THE INVENTION

1. Field of the Invention

This invention relates to a superconducting logic circuit comprising Josephson junctions and superconducting inductors. In particular it relates to a unidirectional single-flux-quantum logic circuit which can be operated with less than a three-phase clock.

2. Description of the Prior Art

Since Josephson junctions operate very quickly and consume only a little power, significant attention has been paid to them as possible elements for high-performance computers. In general, Josephson junctions can be classified into two types; namely, the tunnel type and the bridge type. So far, tunnel type Josephson junctions with hysteretic effect of current-voltage characteristics have been used in digital circuits, while assigning the zero-voltage state and the finite-voltage state of the junction to the binary logical values respectively. On the other hand, as compared with the case of the tunnel type, the junction capacitances of the bridge type Josephson junctions are negligible, so that bridge type Josephson junctions are expected to operate faster than the tunnel type. Since bridge type Josephson junctions have no hysteretic effect in the current-voltage characteristics, the magnetic flux quantum (to be referred to as "flux quantum" hereinafter) is used as the information carrier in the logic circuits made of bridge type junctions.

Two groups of flux quantum logic circuits using the magnetic quantum as the information carrier have been proposed heretofore; namely, a group using one-junction superconducting quantum interference devices (to be referred to as SQUID's hereinafter) and another group using two-junction SQUID's. The group using the two-junction SQUID's has a shortcoming in that it is easily susceptible to the so-called latch-up or permanent transition of its Josephson junctions to finite-voltage state, so that its regular operating region is comparatively small.

In either group of the flux quantum logic circuits of the prior art, a polyphase clock having three or more phases is necessary to ensure unidirectional transmission of signal therethrough. With the polyphase clock, complicated polyphase wiring is indispensable, so that the process of producing such logic circuit is also complicated. Miniaturization of such a logic circuit with polyphase clock wiring into an integrated circuit (IC) has been attempted, but the clock wiring has been found to occupy an unduly large area in the IC. Besides, the transmission time per one step of the logic circuit depends on the period of the clock, so that the very high speed characteristics of the Josephson junctions cannot be fully utilized when a polyphase clock is used.

SUMMARY OF THE INVENTION

Therefore, an object of the invention is to obviate the above-mentioned shortcomings of the prior art by providing an improved flux-quantum logic circuit having a large regular operating region, in which signals are transmitted unidirectionally by using a clock that is not required to be a three-phase or other polyphase.

To fulfil the above object, superconducting flux-quantum logic circuit according to the invention uses a formation in which two one-junction SQUID's are connected by a superconducting inductor and the unidirectionality of the signal transmission is achieved by applying asymmetric bias currents to the Josephson junctions of the two SQUID's. In the logic circuit of the invention, each Josephson junction is individually shunted by respective superconducting inductors, so as to provide plural loops of Josephson junctions and superconducting inductors, the loops being successively linked with each other through a common Josephson junction, so that the Josephson junction is prevented from the latch-up or the permanent transition to its finite-voltage state. Further, the Josephson junctions individually shunted by inductors in the logic circuit of the invention are always in superconducting state except the switching period, so that the power consumption in the logic circuit is very small.

BRIEF DESCRIPTION OF THE DRAWINGS

For a better understanding of the invention, reference is made to the accompanying drawings, in which:

FIG. 3 is a schematic circuit diagram of another superconducting logic circuit according to the invention, in which two SQUID's are connected by a T-circuit made of two inductors and a Josephson junction;

FIG. 4 is a graph showing computer-simulated threshold values of bias current and input current for gating the logic circuit of FIG. 3;

FIG. 7 is a graph showing the result of a computer simulation of the manner in which an input signal applied to an output side of the last stage of the three-stage logic circuit referred to in FIG. 6 is prevented from reverse transmission toward the preceding stages.

Throughout different views of the drawings, 1 is a Josephson junction with a critical current $I_o$, 2 is a Josephson junction with a critical current $aI_o$, a being a constant presenting the ratio of critical currents between Josephson junctions 1, 2, 3 is an inductor with an inductance $L_1$, 4 is an inductor with an inductance $L_2$, 5 is an inductor with an inductance $L_3$, 6 is a bias current with a magnitude $I_{B1}$, 7 is a bias current with a magnitude $I_{B2}$, 8 is a Josephson junction, 9 is an inductor, 10 is a superconducting current, 11 is a parallel resistance of a Josephson junction, 12 is a parallel capacitance of a Josephson junction, and $I_c$ and $I_c'$ are input currents.

DESCRIPTION OF THE PREFERRED EMBODIMENTS

The invention will be described in detail now by referring to preferred embodiments shown in the accompanying drawings.

Figure 1:
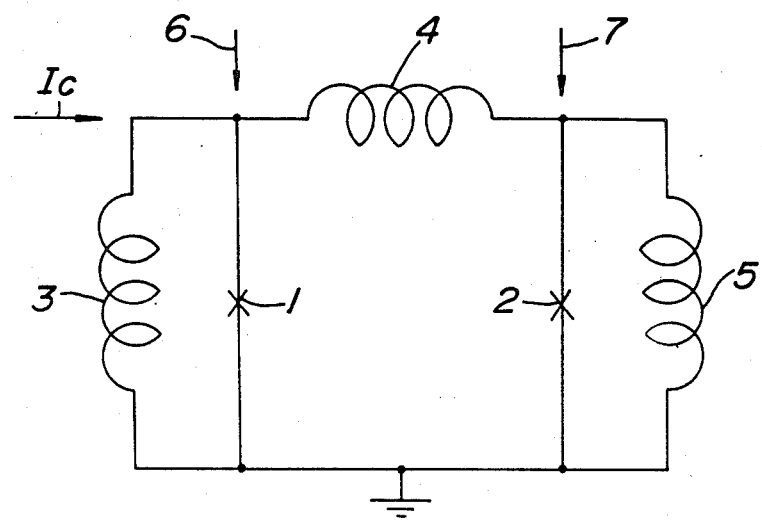
FIG. 1 is a schematic circuit diagram of a super-conducting logic circuit according to the invention.

FIG. 1 shows a fundamental gate circuit embodying the superconducting logic circuit according to the invention. Josephson junctions 1 and 2 are shunted by superconducting inductors 3 and 5 respectively. The inductors 3 and 5 are formed of superconductors of SQUID's carrying the Josephson junctions 1 and 2. One end of the Josephson junction 1 is directly connected to the corresponding end of the Josephson junction 2 to each other, while the opposite ends of the Josephson junctions 1 and 2 are connected to each other through a superconducting inductor 4. Bias currents 6 and 7 are applied to the Josephson junctions 1 and 2 respectively.

The logic circuit of FIG. 1 has three superconducting loops; namely, a loop formed of the Josephson junction 1 and the inductor 3, a loop formed of the Josephson junction 2 and the inductor 5, and a loop formed of the Josephson junctions 1 and 2 and the inductor 4. The condition of flux quantization in the fluxoid through the superconducting loop including the outer inductor requires that the sum of flux quanta in the above-mentioned three superconducting loops must be always zero.

The operating principles of the gate circuit of FIG. 1 will now be described. It is assumed that both when no bias currents are applied to the Josephson junctions 1 and 2 and when only the bias currents are applied to the Josephson junctions 1 and 2, there is no magnetic quantum in any of the three superconducting loops. The state of having no magnetic quantum is assumed to correspond to the binary logical state "0".

When an input current $I_c$ is applied to the left-hand side Josephson junction 1, if the current through the Josephson junction 1 surpasses its critical current value, this Josephson junction 1 is momentarily switched to its finite-voltage stae, so that a counter-clockwise circulating current flows through the left-hand side superconducting loop and a clockwise circulating current flows through the central superconducting loop, so as to satisfy the fluxoid quantization condition. In response to such circulating currents, the current through the right-hand side Josephson junction 2 surpasses its critical current value, and this Josephson junction 2 is momentarily switched to its finite-voltage state, and the clockwise circulating current is transferred to the right-hand side superconducting loop.

For simplicity, only the circulating currents are described in the foregoing. The counter-clockwise circulating current represents a flux quantum from the backside of the plane of FIG. 1 to the front side of that plane, while the clockwise circulating current represents a flux quantum from the front side of that plane to the backside thereof. Thus, in response to the generation and transfer of the above circulating currents, the flux quantum is generated and transferred in the gate circuit. More specifically, after the circulating currents are generated and transferred, a flux quantum from the backside to the front side of the plane of FIG. 1 exists in the left-hand side superconducting loop of the figure, while a flux quantum from the front side to the backside of the plane exists in the right-hand side superconducting loop. The state with such flux quanta is assumed to correspond to the binary logical state "1".

To couple a plurality of the gates of FIG. 1 in tandem, the right-hand side inductor 5 of a preceding gate is coupled to the left-hand side inductor 3 of the next succeeding gate either by mutual inductance therebetween or by a suitable current injection type coupling. The coupling may be such that, in response to the flow of a circulating current in the right-hand side superconducting loop of the preceding gate, the current through the Josephson junction 1 in the left-hand side superconducting loop of the next succeeding gate is increased in excess of the value of the critical current thereof.

Figure 2:
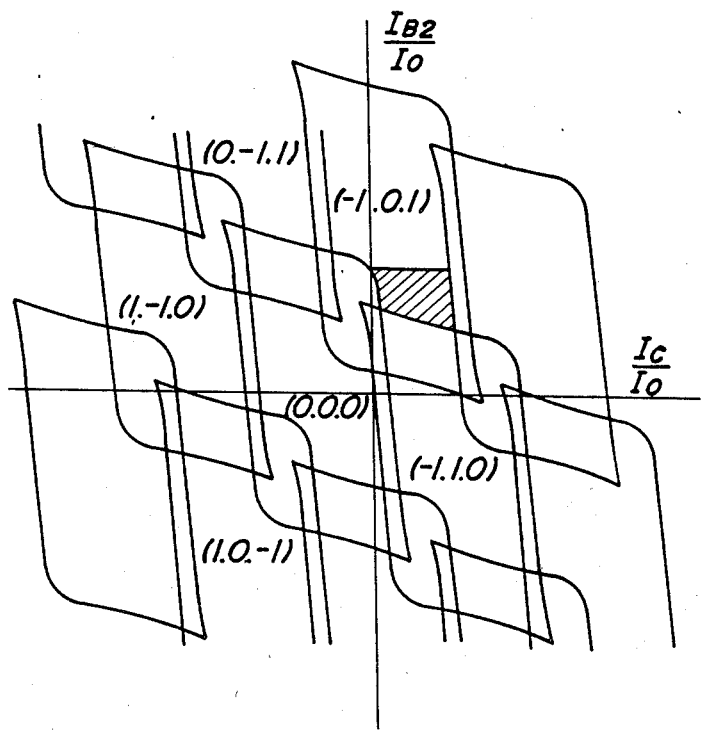
FIG. 2 is a graph showing computer-simulated threshold values of bias current and input current for gating the logic circuit of FIG. 1.

FIG. 2 shows the result of a simulated calculation of the threshold values of the bias current and the input current in the gate of FIG. 1. Conditions for the simulated calculation are similar to what will be described hereinafter in relation to the example of simulated operation. The bits in the parentheses of FIG. 2 represent the circulating currents in the three superconducting loops of the gate; namely, 1 represents a counter-clockwise circulating current, $-1$ represents a clockwise circulating current, and 0 represents the absence of any circulating circuit. Thus, the above-mentioned binary logical states "0" and "1" correspond to the modes (0,0,0) and ($-1$,0,1) respectively.

It is one of the important features of the invention that any point on the entire $I_{B2}$–$I_C$ plane falls in at least one mode of the threshold value characteristics, so that the Josephson junctions in the gate of FIG. 1 never become permanently finite-voltage state. The fluxoid quantizing condition of that superconducting loop which includes one of the outer inductors requires that the sum of the three bits in each paired parentheses of FIG. 2 must be zero, so that each mode has a sufficiently broad region which is not overlapped with other modes.

The hatched portion of FIG. 2 represents an operating region. Since the thus hatched region falls only in the ($-1$,0,1) mode, this mode operation of the gate is stable in the hatched region. It is noted that the hatched region or the operating region can be expanded by adding another Josephson junction in the gate as shown in FIG. 3. More specifically, the additional Josephson junction 8 of FIG. 3 forms a T circuit with two inductors 4 and 9, and this T circuit replaces the single inductor 4 of FIG. 1. Thus, the serially-joined inductors 4 and 9 connect the Josephson junctions 1 and 2 at one side ends thereof. The Josephson junction 8 is connected between the two inductor 4, 9 and the directly-connected portion of the two Josephson junctions 1, 2.

The operating principle of the gate of FIG. 3 is the same as that of FIG. 1. More particularly, when an input current $I_C$ is applied to the left-hand side superconducting loop, a counter-clockwise circulating current is produced therein and a clockwise circulating current is produced in the second superconducting loop from the left end of the gate. The clockwise circulating current is then transferred to the right-hand end superconducting loop of the gate in the same manner as the clockwise circulating current in the case of the gate of FIG. 1.

FIG. 4 shows the result of simulated calculation of the threshold values of the bias current $I_{B2}$ and the input current $I_C$ for the gate of FIG. 3. The simulated calculation is carried out in the similar manner as that of FIG. 2. It is noted that the hatched region or the operating region of FIG. 4 is boarder than that of FIG. 2. It is another important feature of the invention to expand the operating region by adding a combination of an inductor and a Josephson junction, which combination has a small value of the product of the inductance of the inductor and the critical current of the Josephson junction.

The inventors have confirmed that the superconducting logic circuit of the invention operates satisfactorily by carrying out computerized simulations of the operation of the gate circuits described above as an embodiment of the invention. An example of the simulated operation will be described in detail now.

Example of Simulated Operation

Figure 5:
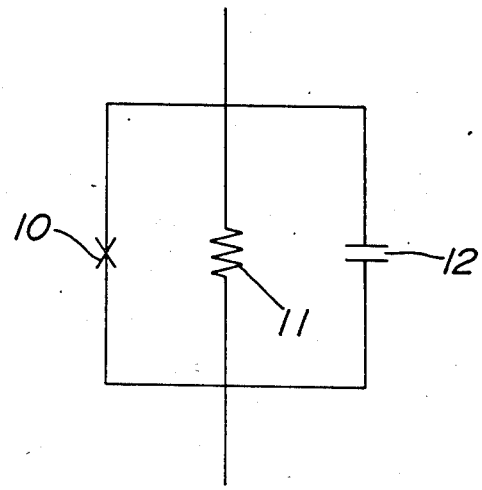
FIG. 5 is a diagram showing an equivalent circuit of Josephson junction which is assumed in the simulation of its operation.

The operation of a logic circuit having three gates of FIG. 1 connected in tandem was simulated by a computer. In the simulation, the Josephson junction was replaced by a regularly used equivalent circuit as shown in FIG. 5; namely, the equivalent circuit comprising three parallel elements, a superconducting D.C. current 10, a resistor 11 with a resistance $R_n$, and a capacitor 12. Since the superconducting logic circuit of the invention uses the bridge type Josephson junction which operates extremely quickly and the capacitance of the parallel capacitor 12 in the equivalent circuit of FIG. 5 is negligible, the parallel capacitor 12 was neglected in the approximation for the simulation. Such approximation was quite reasonable in the simulation, because the outcome of the simulation was in very close agreement with the actual operation even if such approximation was used.

To confirm the unidirectionality of signal transmission in the superconducting logic circuit, which is an important feature of the invention, the operation was simulated for two cases; namely a first case in which an input signal was applied to the input side of the first stage of the gates connected in tandem, and a second case in which an input signal was applied to the output side of the last stage thereof. The result of the simulation for the first case is shown in FIG. 6, while the result for the second case is shown in FIG. 7.

The values of parameters used in the simulation were as follows: namely, $a = 2$
$L_1 I_0 = L_2 I_0 = (\frac{1}{4}) \phi_0$
$L_3 I_0 = (\frac{1}{8}) \phi_0$
$I_{B1} = I_0$
$I_{B2} = (3/2) I_0$
$I_C = (\frac{1}{2}) I_0$
$I_C' = 2 I_0$
$I_0 R_n = 2.6$ mV Here, $\phi_0$ represents the flux quantum whose magnitude is $2.068 \times 10^{-15}$ (Wb), $I_C$ is an input current applied to the input side of the first stage, and $I_C'$ is an input current applied to the output side of the last stage.

Figure 6:
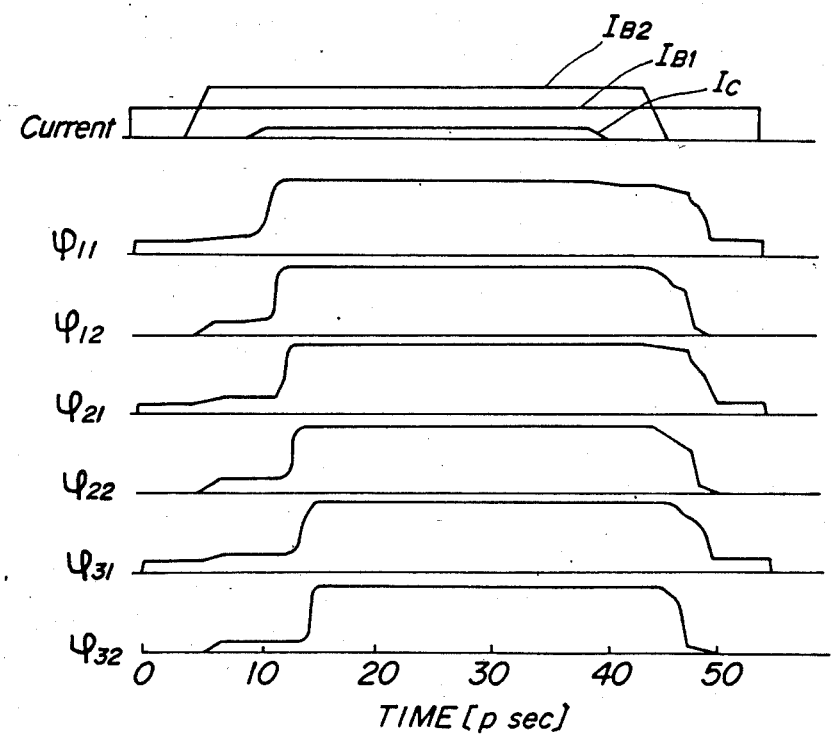
FIG. 6 is a graph showing the result of a computer simulation of the manner in which an input signal applied to an input side the first stage of a three-stage logic circuit is transmitted therethrough, each stage being formed of the circuit of FIG. 1.

In FIG. 6 and FIG. 7, $\phi_{11}$ and $\phi_{12}$ represent the phase differences of superconducting electrons at opposite ends of the left-hand side Josephson junction (corresponding to the junction 1 of FIG. 1) and the right-hand side Josephson junction (corresponding to the junction 2 of FIG. 1) of the first stage gate respectively; $\phi_{21}$ and $\phi_{22}$ represent similar phase differences of the left-hand side and the right-hand side Josephson junctions in the second stage gate respectively; and $\phi_{31}$ and $\phi_{32}$ represent similar phase differences of the left-hand side and the right-hand side Josephson junctions of the third stage gate respectively.

It is noted that when the flux quantum exists in the left-hand side superconducting loop, the phase difference at the left-hand side Josephson junction is increased by about $2\pi$, while when the flux quantum exists in the right-hand side superconducting loop, the phase difference at the right-hand side Josephson junction is increased by about $2\pi$. Accordingly, in the case of FIG. 6, in response to the application of the input current to the input side of the first stage, the generation and transfer of the flux quantum take place in the first stage at first in accordance with the above-described operating principle, and then the flux quantum is transferred to next succeeding stages, so that the generation and transfer of the flux quantum take place in the second stage and the third stage in succession until the flux quantum reaches the output side superconducting loop of the third stage.

The outcome of the simulated operation as shown in FIG. 6 also indicates that the delay time in transmission is less than 2 p sec per stage. Thus, the invention has made it possible to use the bridge type Josephson junction in a superconducting loop circuit, whereby ultra-high-speed operation is made available in such devices.

FIG. 7 shows the result of the simulation of the operation for the case in which an input current larger than that of FIG. 6 is applied to the output side of the last stage. It is apparent from the figure that the generation of the flux quantum occurs in the last stage, but it is not transferred to the preceding stages. The inventors confirmed by simulation that when the input current to the output side of the last stage was smaller than that of FIG. 7, even the generation of the flux quantum in the last stage did not occur. Thus, it was found that even when a fairly large input current was applied to the output side, the signal represented by such input current was not transferred to the preceding stages.

Similar computer simulation was carried out on the gates with expanded operating region as shown in FIG. 3 under the conditions of three-stage tandem connection. Similar results were obtained with the gates having the expanded operating regions; namely, when the input current was applied to the input side of the first stage, the generation and transfer of the flux quantum occurred in the first stage at first and then transferred to the succeeding stages, while when an input current was applied to the output side of the last stage, even if the generation of the flux quantum was forced to occur in the last stage by using large input currents, such generation of the flux quantum was never transferred to the preceding stages.

As described in the foregoing, with the superconducting logic circuit according to the invention, it has been confirmed by computer simulation that the signal is transmitted unidirectionally only from the input side to the output side of the circuit. Moreover, it has been shown that such unidirectional transmission is effected without using any three-phase clock. Further, it has been proved that the superconducting logic circuit of the invention facilitates the production of an ultra-high-speed logic circuit.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method of unidirectionally transmitting signal through a superconducting logic circuit, which logic circuit includes a first one-Josephson-junction SQUID (superconducting quantum interference device), a second one-Josephson-junction SQUID having a critical current of the junction larger than that of the first SQUID, the Josephson junctions of said first and second SQUID's having one side superconductors thereof directly connected to each other, and a superconducting inductor connecting the opposite side superconductors of the Josephson junctions of said first and second SQUID's, inductance of said superconducting inductor being larger than the inductance of said second SQUID; the method comprising steps of applying a flat bias current to the Josephson junction of the first SQUID while applying a second bias current larger than the first bias current to the second SQUID, and applying an input signal to the first SQUID, whereby the input signal is unidirectionally transmitted to the second SQUID.

2. A method of unidirectionally transmitting signal through a superconducting logic circuit as set forth in claim 1, wherein a plurality of said logic circuits are coupled in tandem, the second SQUID in each logic circuit being electromagnetically coupled to the first SQUID of next succeeding logic circuit, said first and second bias currents are applied to the Josephson junctions of the first and second SQUID's of each logic circuit respectively, and said input signal is applied to the first SQUID of the first one of said logic circuits connected in tandem, whereby the input signal is unidirectionally transmitted to the second SQUID of the logic circuit and then to the next succeeding logic circuit until the input signal reaches the second SQUID of the last one of said logic circuits.

3. A method of unidirectionally transmitting signal through a superconducting logic circuit as set forth in claim 1, wherein said transmitting of the signal is timed by a clock having less than three phases.

4. A superconducting logic circuit comprising a first Josephson-junction SQUID (superconducting quantum interference device), a second Josephson-junction SQUID with a critical current of the junction larger than that of the first SQUID, the Josephson junctions of said first and second SQUID's having on one side superconductors thereof directly connected to each other, serially-joined two superconducting inductors connecting the opposite side superconductors of the Josephson junctions of said first and said SQUID's, a third Josephson junction connected across the joint of said two inductors and said directly connected superconductors of said SQUID's, the inductance of each of said inductors being larger than the inductance of said second SQUID.

5. A method of unidirectionally transmitting signal through a superconducting logic circuit, which logic circuit includes a first Josephson-junction SQUID (superconducting quantum interference device), a second Josephson-junction SQUID with a critical current of the junction larger than that of the first SQUID, the Josephson junctions of said first and second SQUID's having one side superconductors thereof directly connected to each other, serially-joined two superconducting inductors connecting the opposite side superconductors of the Josephson junctions of said first and second SQUID's, and a third Josephson junction connected across the joint of said two inductors and said directly connected superconductors of said SQUID's, the inductance of each of said inductors being larger than the inductance of said second SQUID; the method comprising steps of applying a first bias current to the Josephson junction of the first SQUID while applying a second bias current at least to the second SQUID, the second bias current being larger than the first bias current, and applying an input signal to the first SQUID, whereby the input signal is unidirectionally transmitted to the second SQUID.

6. A method of unidirectionally transmitting signal through a superconducting logic circuit as set forth in claim 5 wherein a plurality of said logic circuits are coupled in tandem, the second SQUID in each logic circuit being electromagnetically coupled to the first SQUID of next succeeding logic circuit, said first and second bias currents are applied to the Josephson junctions of the first and at least to second SQUID's of each logic circuit respectively, and said input signal is applied to the first SQUID of the first one of said logic circuits connected in tandem, whereby the input signal is unidirectionally transmitted to the second SQUID of the logic circuit and then to the next succeeding logic circuit until the input signal reaches the second SQUID of the last one of said logic circuits.

7. A method of unidirectionally transmitting signal through a superconducting logic circuit as set forth in claim 2, wherein said transmitting of the signal is timed by a clock having less than three phases.

8. A superconducting logic circuit comprising
a plurality of Josephson junctions including
a first Josephson junction which is shunted by a first superconducting inductor and applied with a logic input, and
a second Josephson junction which is shunted by a second superconducting inductor and taken out of a logic output,
respective first ends of said plurality of Josephson junctions being directly connected,
respective second ends of said plurality of Josephson junctions being connected to each other through at least one superconducting inductor,
conditioning currents respectively flowing through each of said plurality of Josephson junctions being successively larger, whereby a plurality of loops respectively consisting of at least one Josephson junction of said plurality of Josephson junctions and a superconducting inductor are successively linked with each other through each of said plurality of Josephson junctions, so as to unidirectionally transmit the logic signal.

9. A superconducting logic circuit as claimed in claim 8, wherein the transmission of said logic signal is timed by a clock which has less than three phases.

10. A superconducting logic circuit as claimed in claim 8, wherein the respective second ends of said first and said second Josephson junctions are connected to each other through two serially-joined superconducting inductors, to the junction of which the second end of a third Josephson junction of said plurality of Josephson junctions is connected.

11. A superconducting logic circuit consisting of plural stages of said superconducting logic circuit as claimed in claim 8, wherein said plural stages are coupled in cascade by electromagnetically coupling said second superconducting inductor in each stage with said first superconducting inductor in the subsequent stage, whereby said logic signal is unidirectionally transmitted through said plural stages of said superconducting logic circuits.

* * * * *